(12) United States Patent
Ding et al.

(10) Patent No.: US 11,567,223 B2
(45) Date of Patent: Jan. 31, 2023

(54) SCINTILLATION MATERIAL OF RARE EARTH ORTHOSILICATE DOPED WITH STRONG ELECTRON-AFFINITIVE ELEMENT AND ITS PREPARATION METHOD AND APPLICATION THEREOF

(71) Applicant: SHANGHAI INSTITUTE OF CERAMICS, CHINESE ACADEMY OF SCIENCES, Shanghai (CN)

(72) Inventors: Dongzhou Ding, Shanghai (CN); Shuwen Zhao, Shanghai (CN); Fan Yang, Shanghai (CN); Junjie Shi, Shanghai (CN); Chen Yuan, Shanghai (CN); Linwei Wang, Shanghai (CN); Zhongjun Xue, Shanghai (CN)

(73) Assignee: SHANGHAI INSTITUTE OF CERAMICS, CHINESE ACADEMY OF SCIENCES, Shanghai (CN)

( * ) Notice: Subject to any disclaimer, the term of this patent is extended or adjusted under 35 U.S.C. 154(b) by 0 days.

(21) Appl. No.: 17/454,688

(22) Filed: Nov. 12, 2021

(65) Prior Publication Data

US 2022/0155470 A1 May 19, 2022

(30) Foreign Application Priority Data

Nov. 16, 2020 (CN) .......................... 202011280944.0

(51) Int. Cl.
*G01T 1/20* (2006.01)
*G01T 1/202* (2006.01)
(Continued)

(52) U.S. Cl.
CPC ............ *G01T 1/2023* (2013.01); *C04B 35/16* (2013.01); *C30B 28/02* (2013.01); *C30B 29/22* (2013.01)

(58) Field of Classification Search
CPC ....... G01T 1/2023; C04B 35/16; C30B 28/02; C30B 29/22
See application file for complete search history.

(56) References Cited

U.S. PATENT DOCUMENTS

2018/0094189 A1* 4/2018 Blahuta ............ C09K 11/77744

FOREIGN PATENT DOCUMENTS

CN             108139492 A      6/2018

OTHER PUBLICATIONS

M. Buryi et al., Rare-earth ions incorporation into Lu2Si2O7 scintillator crystals: Electron paramagnetic resonance and luminescence study, Optical Materials, http://www.elsevier.com/locate/optmat, Accepted Apr. 18, 2020. (Year: 2020).*

(Continued)

*Primary Examiner* — Hugh Maupin
(74) *Attorney, Agent, or Firm* — Alleman Hall Creasman & Tuttle LLP

(57) ABSTRACT

The invention relates to a scintillation material of rare earth orthosilicate doped with a strong electron-affinitive element and its preparation method and application thereof. The chemical formula of the scintillation material of rare earth orthosilicate doped with the strong electron-affinitive element is: $RE_{2(1-x-y+\delta/2)}Ce_{2x}M_{(2y-\delta)}Si_{(1-\delta)}M_{\delta}O_5$. In the formula, RE is rare earth ions and M is strong electron-affinitive doping elements; the value of x is $0<x\leq0.05$, the value of y is $0<y\leq0.015$, and the value of $\delta$ is $0\leq\delta\leq10-4$; and M is selected from at least one of tungsten, lead, molybdenum, tellurium, antimony, bismuth, mercury, silver, nickel, indium, thallium, niobium, titanium, tantalum, tin, cadmium, technetium, zirconium, rhenium, and gallium Ga.

10 Claims, 9 Drawing Sheets

(51) Int. Cl.
*C04B 35/16* (2006.01)
*C30B 28/02* (2006.01)
*C30B 29/22* (2006.01)

(56) References Cited

OTHER PUBLICATIONS

Shimura, N. et al., "Zr Doped GSO:Ce Single Crystals and Their Scintillation Performance," IEEE Transactions on Nuclear Science, vol. 53, No. 5, Oct. 2006, 4 pages.

* cited by examiner

SCINTILLATION MATERIAL OF RARE EARTH ORTHOSILICATE DOPED WITH STRONG ELECTRON-AFFINITIVE ELEMENT AND ITS PREPARATION METHOD AND APPLICATION THEREOF

TECHNICAL FIELD

The invention relates to a scintillation material of rare earth orthosilicate doped with a strong electron-affinitive element and its preparation method and application thereof, which belongs to the technical field of scintillation materials.

BACKGROUND

Inorganic scintillation materials are a kind of energy converter which can convert high energy photons (X or γ-rays) or particles (protons, neutrons, etc.) into ultraviolet/visible photons that are convenient for detection. Inorganic scintillation detectors are widely used in high energy physics, nuclear physics, space physics, nuclear medical diagnosis (X-CT, PET), geological exploration, and safety inspection. With the rapid development of nuclear detection and related technologies, higher requirements are imposed on the performance of scintillation crystals. Traditional NaI:Tl, $Bi_4Ge_3O_{12}$ (BGO), and $PdWO_4$ (PWO) scintillation crystals cannot meet the application requirements. The novel aluminate and silicate scintillation crystals have gradually become a research hotspot due to the characteristics of high light output, fast decay time, and the like.

The rare earth ion $Ce^{3+}$ is used as an activator, and high intensity and fast decay luminescence is obtained by utilizing the space allowed transition of 5d→4f of $Ce^{3+}$. For example, a series of Ce:YAG, Ce:GAGG, Ce:LYSO, Ce:GSO, Ce:YAP, and Ce:LuAP are emerging as a group of new scintillation materials. Compared with the traditional NaI:Tl, BGO, $BaF_2$, PWO inorganic scintillation crystals, the results show that $Ce^{3+}$-doped high temperature oxide crystals have both high light output (about 2-10 times that of BGO crystals) and fast decay time (about ⅕-1/20 that of BGO crystals) characteristics. Therefore, these kinds of high-temperature oxide crystals doped with $Ce^{3+}$ with excellent performance have attracted great attention from the scientific community. For example, $Ce^{3+}$-doped rare earth orthosilicate scintillators have the characteristics of high light yield, fast luminescence decay, a large effective atomic number, high density, etc., and is a scintillation material with excellent performance. However, in the field of high-energy physics and nuclear medical imaging, the specialist in the art has put higher demands on the temporal characteristics of $Ce^{3+}$-doped rare earth orthosilicate scintillators.

Among the rare earth orthosilicate matrices, lutetium silicate is the most widely studied. In its structure, the rare earth lattice sites of lutetium silicate have two kinds of chemical environments (Lu1 and Lu2) and are the same in number. Specifically, seven oxygen species around Lu1 form with [$LuO_7$]. The seven oxygen species are coordinated by two [$OLu_4$], three [$OLu_2Si$], and two [$OLu_3Si$]. And the six oxygen species around Lu2 form [$LuO_6$]. The six oxygen species are coordinated by two [$OLu_4$], three [$OLu_2Si$], and one [$OLu_3Si$] respectively. In contrast, Lu1 has one more oxygen [$OLu_3Si$] than Lu2, and the residual charge of [$OLu_3Si$] is >0 which can be estimated simply by the Pauling electrostatic valence rule. This result indicates that Lu1 sites have more positive charges than Lu2 sites, i.e., the electron concentration at Lu2 sites is higher than Lu1 sites. Similarly, the activation ion $Ce^{3+}$ into the rare earth sites will also have a selective distribution.

Patent 1 (Chinese publication No. CN108139492A) discloses that the A-site doping of Ni, Zr, Nb, Mo, Ru, Rh, Ag, Ta, W, In, Sn, Sb, Tl, Pb, and Bi ions into an $A_2SiO_5$ orthosilicate scintillator realizes a non-radiative energy transfer to take part of the energy away from the excited activator centers, resulting in a significant reduction in the duration of the dominant amplitude component of the scintillation response. However, patent 1 is based on the principle that a part of the energy of activators is taken away to shorten the emission duration, which requires a higher content of added dopant ions. Reference 1 (IEEE Transactions on nuclear science, 2006, 53:2519-2522) mentions that incorporation of a specific content (x=0.0001-0.001) of $Zr^{4+}$ in place of $Gd^{3+}$ ions in Ce:GSO resulted in charge compensation to reduce the conversion of $Ce^{3+}$ to $Ce^{4+}$ in the crystal. The main purpose of reference 1 is to improve the light output of the crystal, but it is observed that Zr, HF, Ti, GA, Ge, La, Pr doping at a specific content (x=0.0001-0.001) has little effect on the decay time of the Ce:GSO crystal.

SUMMARY

According to the practical application needs and the aim of achieving the above purpose, this invention aims to provide a method for obtaining ultrafast luminescence by doping a scintillation material of rare earth orthosilicate with a strong electron-affinitive element and application thereof. The novel scintillation material with ultrafast luminescence property prepared by this invention can better meet the use requirements of high energy physical detection, particle discrimination, and fast nuclear medical imaging (TOF-PET, PET-CT, and PET-MRI).

In a first aspect, the present invention provides a scintillation material of rare earth orthosilicate doped with a strong electron-affinitive element, the chemical formula of the scintillation material being: $RE_{2(1-x-y+\delta/2-a)}Ce_{2x}M_{(2y-\delta)}A_{2a}Si_{(1-\delta)}M_\delta O_5$. RE is rare earth ions and M is strong electron-affinitive doping elements. The value of x is $0<x\le0.05$, the value of y is $0<y\le0.015$, the value of δ is $0\le\delta\le10^{-4}$, and the value of a is $0\le a\le0.01$. M is selected from at least one of tungsten, lead, molybdenum, tellurium, antimony, bismuth, mercury, silver, nickel, indium, thallium, niobium, titanium, tantalum, tin, cadmium, technetium, zirconium, rhenium, and gallium. A is selected from at least one of lithium, sodium, potassium, rubidium, cesium, magnesium, calcium, strontium, scandium, and copper.

In the present disclosure, based on the fact that the scintillation material of the rare earth orthosilicate contains a $Ce^{3+}$ ion as the luminescence center, the $Ce^{3+}$ ion has two chemical environments Ce1 ([$CeO_7$]) and Ce2 ([$CeO_6$]). By selecting and adding a small amount of the strong electron-affinitive element (with a larger electronegativity) and an element which easily enters into 6-coordination to form [$MO_6$] instead of [$MO_7$], the doped element M preferentially occupies the $RE_2$ position of 6-coordination, and the content of activating ion $Ce^{3+}$ occupying 7-coordination is increased, so that the time characteristic can be significantly shortened. When M is selected from at least one of tungsten, lead, molybdenum, tellurium, antimony, bismuth, mercury, silver, nickel, indium, thallium, niobium, tantalum, tin, cadmium, technetium and rhenium, the value of y is $0.000005\le y\le0.015$; and when M is selected from at least one of titanium, zirconium, and gallium, the value of y is $0.0006\le y\le0.015$.

Preferably, a molar ratio of [CeO$_7$] and [CeO$_6$] in the scintillation material is (4~100):1.

Preferably, RE is selected from at least one of lanthanum, cerium, praseodymium, neodymium, promethium, samarium, europium, gadolinium, terbium, dysprosium, holmium, erbium, thulium, ytterbium, lutetium, scandium, and yttrium.

Preferably, the value of a is 0<a≤0.01.

Preferably, the scintillation material is polycrystalline powders, ceramics, or single crystals.

In a second aspect, the invention provides a method for preparing scintillation polycrystalline powder of rare earth orthosilicate doped with the strong electron-affinitive element, which comprises the following steps:

Step (1): according to the chemical formula of the scintillation polycrystalline powder of, weighing at least one of an oxide of A or a carbonate of A, the oxide of M, CeO$_2$, SiO$_2$, and an oxide of RE, and mixing to obtain mixture powder. where A is selected from at least one of lithium, sodium, potassium, rubidium, cesium, magnesium, calcium, strontium, scandium, and copper.

Step (2): carrying out a solid-phase reaction on the obtained mixture powder at 1000-2000° C. for 5 to 200 hours to obtain cerium co-doped orthosilicate polycrystalline powder.

In a third aspect, the invention provides a method for preparing a scintillation ceramic of rare earth orthosilicate doped with a strong electron-affinitive element, which comprises the following steps:

(1) referring to the preparation step (1) of the polycrystalline powder, obtaining a mixture powder;

(2) pressing the obtained mixture powder, and carrying out a solid-phase reaction at 1000-2000° C. for 5 to 200 hours to obtain the cerium co-doped orthosilicate scintillation ceramic. Preferably, the pressure for the press forming is 0.03 to 5 GPa.

In a fourth aspect, the invention provides a method for preparing a scintillation single crystal of rare earth orthosilicate doped with a strong electron-affinitive element, which comprises the following steps:

(1) referring to the preparation step (1) of the polycrystalline powder, obtaining a mixed powder;

(2) heating the obtained mixture powder to be molten, and growing the scintillation single crystal of rare earth orthosilicate doped with the strong electron-affinitive element by adopting a pulling method, a Bridgman method, a temperature gradient (TGT) method, a heat-exchange method, a Kyropoulos method, a top-seeded solution growth (TSSG) method, a fluxing agent crystal growth method, or a micro pull-down (μ-PD) method.

In a fifth method, the invention provides an application of the scintillation material of rare earth orthosilicate doped with the strong electron-affinitive element in the fields of high-energy physical detection for particle discrimination and fast-responsible nuclear medical imaging.

Beneficial Effect:

1. This patent proposes a technical scheme of a scintillation material of rare earth orthosilicate doped with a strong electron-affinitive element, and suitable doped ions are screened out according to reasonable prediction and experimental verification.

2. By doping strong electron-affinitive elements, the luminescence decay time and the rise time of rare earth orthosilicate scintillation material are greatly shortened. The results show that the luminescent performance of the rare earth orthosilicate scintillation material can be enhanced to a certain extent under the condition of suitable doping concentration of partial ions (partial strong electron-affinitive element).

3. By doping strong electron-affinitive elements, the scintillation material of rare earth orthosilicate can obtain ultra-fast luminous performance, and can be better applied to high-energy physical detection, particle identification, and fast nuclear medical imaging (TOF-PET, PET-CT, and PET-MRI).

DETAILED DESCRIPTION

Figure 1:
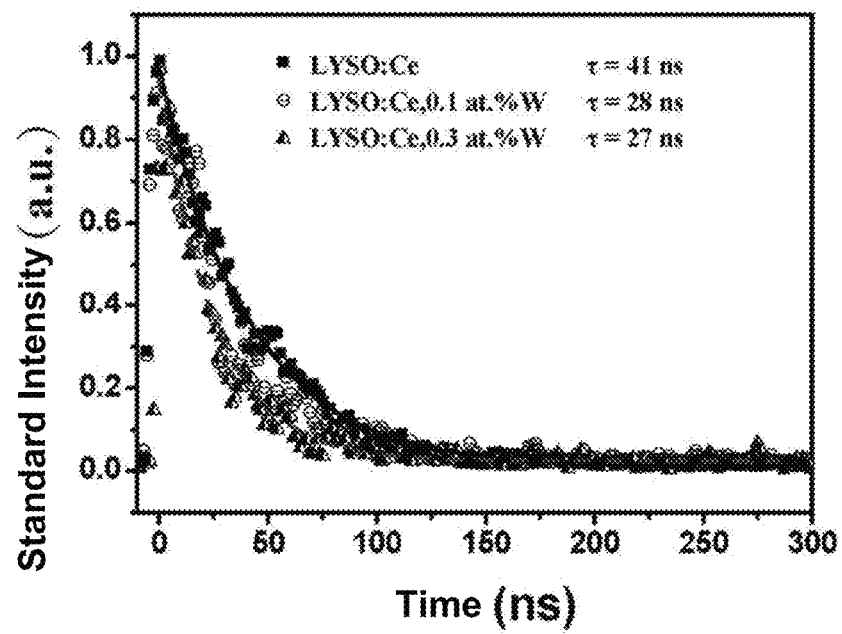
FIG. 1 shows a scintillation decay time spectrum and fitting results for the non-transparent ceramic of example 3.

The present invention will be further illustrated by the following embodiments. It should be understood that the following embodiments are only used to illustrate the present invention, but are not a limitation of the present invention.

In this disclosure, by doping the strong electron-affinitive element into a rare earth site or a rare earth site and a small amount of silicon sites of a cerium-doped rare earth orthosilicate scintillation material, at least one of the decay time and the rise time of luminescence is shortened, ultra-fast luminescence of the rare earth orthosilicate scintillation materials is realized. The method has universal applicability to rare earth orthosilicate scintillation materials, has important significance for doping rare earth orthosilicate scintillation materials with strong electron-affinitive elements, and is expected to obtain new component materials with excellent performance.

Moreover, in the present invention, in addition to achieving at least one of a reduction in the decay time and rise time of luminescence, at least one of an increase in scintillation light output/light yield, an optimization in energy resolution, an increase in fluorescence emission intensity, or an increase in X-ray excitation emission intensity is accompanied. If the y value is too high, the performance degradation of scintillation light output/light yield, energy resolution, fluorescence emission intensity, or X-ray excitation emission intensity is less than 20%. Among them, the luminescence includes scintillation luminescence and photoluminescence.

In the present disclosure, the scintillation material based on the rare earth orthosilicate doped with the strong electron-affinitive element belongs to the monoclinic system, and its chemical formula can be: $RE_{2(1-x-y+\delta/2)}Ce_{2x}M_{(2y-\delta)}Si_{(1-\delta)}M_{\delta}O_5$; wherein $2(1-x-y+\delta/2)$ is the content of matrix ions RE (rare earth), and $2x$ is the content of doping ions $Ce^{3+}$, and $2y-\delta$ is the content of doping elements M with the strong electron-affinitive, and the content of the matrix $Si^{4+}$ is $1-\delta$; the value of x is $0<x\leq0.05$ (preferably $0.0005\leq x\leq0.005$, preferably $0.001\leq x\leq0.005$), and the value of y is $0<y\leq0.015$ (preferably $0.000005\leq y\leq0.01$, preferably $0.001\leq y\leq0.01$). Considering the strong electron-affinitive element M mainly occupies rare earth lattice site, the value of $\delta$ is $0\leq\delta\leq10^{-4}$ (where $\delta$ is determined by the radius of doping ions). Furthermore, according to the research of the inventor, the following results are found: under the condition of suitable components of tungsten (W), lead (Pb), molybdenum (Mo), tellurium (Te), antimony (Sb), bismuth (Bi), indium (In), silver (Ag), nickel (Ni), niobium (Nb), titanium (Ti), tantalum (Ta), tin (Sn), cadmium (Cd), technetium (Tc), zirconium (Zr), rhenium (Re), and gallium (Ga), the luminescence decay time and the rise time are significantly shortened, and the luminescence performance is significantly enhanced (gain of light yield is obtained), and the content of Ce1 is greatly increased.

In an alternative embodiment, RE is a rare earth ion, and specifically includes at least one of lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), scandium (Sc), and yttrium (Y). Preferably, lutetium (Lu), yttrium (Y) or gadolinium (Gd), or any two or three thereof, dissolved in a certain ratio. More preferably, Lu:Y=9:1.

In an alternative embodiment, the strong electron-affinitive dopant element M has a cation with an electronegativity greater than 1.3 and readily combines with oxygen to form an octahedral 6-coordination structure $[MO_6]$, including in particular: at least one of tungsten (W), lead (Pb), molybdenum (Mo), tellurium (Te), antimony (Sb), bismuth (Bi), mercury (Hg), silver (Ag), nickel (Ni), indium (In), thallium (Tl), niobium (Nb), titanium (Ti), tantalum (Ta), tin (Sn), cadmium (Cd), technetium (Tc), zirconium (Zr), rhenium (Re), and gallium (Ga).

In addition, other dopants can be added to $RE_{2(1-x-y+\delta/2)}Ce_{2x}M_{(2y-\delta)}Si_{(1-\delta)}M_{\delta}O_5$, specifically including at least one of lithium (Li), sodium (Na), potassium (K), rubidium (Rb), cesium (Cs), magnesium (Mg), calcium (Ca), strontium (Sr), scandium (Sc), and copper (Cu).

In the present invention, the scintillation material of rare earth orthosilicate doped with the strong electron-affinitive element can be a single crystal, polycrystalline powder, or ceramic. The preparation method of the rare earth orthosilicate scintillation material doped with the strong electron-affinitive element is exemplarily described below.

The preparation method comprises the steps of taking strong electron-affinitive doped element oxides ($M_aO_b$), $CeO_2$, $SiO_2$, and rare earth oxides ($RE_mO_n$) as raw materials, mixing the raw material components according to the molar weight ratio of $M_aO_b:CeO_2:RE_mO_n:SiO_2=2y/a:2x:2(1-x-y)/m:1$, and fully and uniformly mixing to obtain mixed powder. The purity of the used raw materials is more than 99.99% (4N).

The mixed powder can be directly calcined at 1000-2000° C. for 5-200 hours to carry out a solid-phase reaction to obtain polycrystalline powder. Preferably, the temperature of the solid phase reaction can be 1300-1600° C., and the time can be 10-50 hours.

The mixed powder can be directly pressed into blocks by 0.03-5 GPa and sintered at 1000-2000° C. for 5-200 hours to obtain the ceramic, or adjusting the sintering process to prepare transparent ceramics, such as hot pressing sintering or vacuum sintering. Wherein, the pressure for pressing into the block can be 2-3 GPa. Preferably, the temperature of the solid phase reaction can be 1300-1600° C. and the time can be 10-50 hours.

A single crystal is produced by melting a mixed powder or a polycrystalline powder by heating (resistance, electromagnetic induction, or light, etc.) in a vessel, and then slowly crystallizing it from the melt. The specific method comprises a pulling (Czochralski, Cz) method, a Bridgman method, a temperature gradient (TGT) method, a heat-exchange method, a Kyropoulos method, a top-seeded solution growth (TSSG) method, a fluxing agent crystal growth method, or a micro pull-down (µ-PD) method for growth. The container can be a graphite crucible, an iridium crucible, a molybdenum crucible, a tungsten-molybdenum crucible, a rhenium crucible, or a tantalum crucible. The atmosphere for single crystal growth may be one of, or a mixture of, argon, nitrogen, carbon dioxide, and carbon monoxide.

In an optional embodiment, the single crystal is grown by the pulling method, the container is an iridium crucible, induction heating is adopted, the growth atmosphere is high-purity nitrogen, and the pulling is carried out while rotating, with a pulling speed of 0.7-6.0 mm/h and a rotating speed of 3-20 r/min.

In an alternative embodiment, the rare earth orthosilicate scintillation polycrystalline powder is prepared: the resulting ceramics and single crystals can also be ground into powders by being crushed.

In the present disclosure, during the preparation of the scintillation material of rare earth orthosilicate doped with the strong electron-affinitive element, there may be a very small amount of doping element M which may be doped into the Si site, but it is difficult to obtain its accurate doping content due to technical limitations of conventional characterization means. Of course, the doping of a very small amount of doping element M into the Si site has no essential change to the material properties itself, and is generally regarded as $\delta\approx0$. In addition, the obtained scintillation material of rare earth orthosilicate doped with the strong electron-affinitive element can obtain ultrafast luminescence, and can be better applied to high-energy physical detection for particle discrimination and fast nuclear medical imaging (TOF-PET, PET-CT, and PET-MRI).

The following examples are further given to illustrate the present invention in detail. It should also be understood that the following examples are only used to further illustrate the present invention, and cannot be understood as limiting the scope of protection of the present invention. Some non-essential improvements and adjustments made by those skilled in the art according to the above contents of the present invention belong to the scope of protection of the present invention. The specific process parameters in the following examples are only one example in the appropriate range, that is, those skilled in the art can choose from the appropriate range through the description herein, and are not limited to the specific values in the following examples.

Example 1 (Growth of W Doped Single Crystals)

A single crystal is grown by adopting a pulling method. According to the molar weight ratio of $WO_3:CeO_2:SiO_2:Lu_2O_3:Y_2O_3=2y:0.002:1:0.899-y:0.1$ (y=0.000005, 0.00001, 0.0001, 0.001, 0.003, 0.005, 0.01), and the mixture is obtained by fully and uniformly mixing. The mixture is pressed into blocks under 2500 MPa cold isostatic pressure, put into an iridium crucible, and heated and melted sufficiently by induction. After seed crystal inoculation, a single crystal with a preset size is pulled from the melt to obtain a single $Lu_{1.798-2y}Y_{0.2}Ce_{0.002}W_{2y}SiO_5$ crystal.

Example 2 (Preparation of W Doped Polycrystalline Powders)

The materials according to Example 1 are fully and uniformly mixed to obtain a powder mixture, the powder mixture is put into a corundum crucible, the corundum crucible is put into a muffle furnace, and the corundum crucible is calcined at 1600° C. for 10 hours to perform a solid-state reaction to obtain $Lu_{1.798-2y}Y_{0.2}Ce_{0.002}W_{2y}SiO_5$ polycrystalline powder.

Example 3 (Preparation of W Doped Ceramics)

Non-transparent state: the materials according to Example 1 are fully and uniformly mixed to obtain a mixture. The mixture is pressed into blocks under 30 MPa cold isostatic pressure, the blocks are put into a corundum crucible, the corundum crucible is placed into a muffle furnace, and the corundum crucible is sintered at 1600° C. for 10 hours to perform a solid-state reaction to obtain $Lu_{1.798-2y}Y_{0.2}Ce_{0.002}W_{2y}SiO_5$ or $Lu_{1.798-2y+2y/z}Y_{0.2}Ce_{0.002}W_{2y}Si_{(1-2y/z)}O_5$ non-transparent ceramic. Transparent: the materials according to Example 1 are fully and uniformly mixed to obtain a mixture. The mixture is pressed into blocks under 5000 MPa cold isostatic pressure, and a solid-phase reaction is performed in a vacuum hot-pressing furnace to eliminate bubbles and gaps as much as possible to obtain $Lu_{1.798-2y}Y_{0.2}Ce_{0.002}W_{2y}SiO_5$ transparent ceramic.

Example 4 (Growth of Pb Doped Single Crystals)

The materials are mixed according to the molar ratio of $Pb_3O_4:CeO_2:SiO_2:Lu_2O_3:Y_2O_3=2y/3:0.002:1:0.899-y:0.1$ (y=0.000005, 0.00001, 0.0001, 0.001, 0.003, 0.005, 0.01, 0.02), and the subsequent steps were the same as those in Example 1, thus single crystals of $Lu_{1.798-2y}Y_{0.2}Ce_{0.002}Pb_{2y}SiO_5$ are obtained.

Example 5 (Preparation of Pb Doped Polycrystalline Powders)

The materials according to Example 4 are mixed, the following steps are the same as those in Example 2, and $Lu_{1.798-2y}Y_{0.2}Ce_{0.002}Pb_{2y}SiO_5$ polycrystalline powder is obtained.

Example 6 (Preparation of Pb Doped Ceramics)

$Lu_{1.798-2y}Y_{0.2}Ce_{0.002}Pb_{2y}SiO_5$ opaque ceramics and transparent ceramics are obtained according to the materials of Example 4 and the subsequent steps are the same as those of Example 3.

Example 7 (Growth of Mo Doped Single Crystals)

The materials are mixed according to the molar ratio of $MoO_3:CeO_2:SiO_2:Lu_2O_3:Y_2O_3=2y:0.002:1:0.899-y:0.1$ (y=0.000005, 0.00001, 0.0001, 0.001, 0.003, 0.005, 0.01, 0.02), and the subsequent steps are the same as those in Example 1, thus single crystals of $Lu_{1.798-2y}Y_{0.2}Ce_{0.002}Mo_{2y}SiO_5$ are obtained.

Example 8 (Preparation of Mo Doped Polycrystalline Powders)

The materials according to Example 7 are mixed, the following steps are the same as those in Example 2, and $Lu_{1.798-2y}Y_{0.2}Ce_{0.002}Mo_{2y}SiO_5$ polycrystalline powder is obtained.

Example 9 (Preparation of Mo Doped Ceramics)

$Lu_{1.798-2y}Y_{0.2}Ce_{0.002}Mo_{2y}SiO_5$ opaque ceramics and transparent ceramics are obtained according to the materials of Example 7 and the subsequent steps are the same as those of Example 3.

Example 10 (Growth of Te Doped Single Crystals)

The materials are mixed according to the molar ratio of $TeO_2:CeO_2:SiO_2:Lu_2O_3:Y_2O_3=2y:0.002:1:0.899-y:0.1$ (y=0.000005, 0.00001, 0.0001, 0.001, 0.003, 0.005, 0.01, 0.02), and the subsequent steps are the same as those in Example 1, thus single crystals of $Lu_{1.798-2y}Y_{0.2}Ce_{0.002}Te_{2y}SiO_5$ are obtained.

Example 11 (Preparation of Te Doped Polycrystalline Powders)

The materials according to the materials of Example 10 are mixed, the following steps are the same as those in Example 2, and $Lu_{1.798-2y}Y_{0.2}Ce_{0.002}Te_{2y}SiO_5$ polycrystalline powder is obtained.

Example 12 (Preparation of Te Doped Ceramics)

$Lu_{1.798-2y}Y_{0.2}Ce_{0.002}Te_{2y}SiO_5$ opaque ceramics and transparent ceramics are prepared according to Example 10 and the subsequent steps are the same as those in Example 3.

Example 13 (Growth of Sb Doped Single Crystals)

The materials are mixed according to the molar ratio of $Sb_2O_5:CeO_2:SiO_2:Lu_2O_3:Y_2O_3=y:0.002:1:0.899-y:0.1$ (y=0.000005, 0.00001, 0.0001, 0.001, 0.003, 0.005, 0.01, 0.02), and the subsequent steps are the same as those in Example 1, thus single crystals of $Lu_{1.798-2y}Y_{0.2}Ce_{0.002}Sb_{2y}SiO_5$ are obtained.

Example 14 (Preparation of Sb Doped Polycrystalline Powders)

The materials according to example 13 are mixed, the following steps are the same as those in Example 2, and $Lu_{1.798-2y}Y_{0.2}Ce_{0.002}Sb_{2y}SiO_5$ polycrystalline powder is obtained.

Example 15 (Preparation of Sb Doped Ceramics)

$Lu_{1.798-2y}Y_{0.2}Ce_{0.002}Sb_{2y}SiO_5$ opaque ceramics and transparent ceramics are prepared according to Example 13, and the subsequent steps were the same as those of Example 3.

Example 16 (Growth of Bi Doped Single Crystals)

The materials are mixed according to the molar ratio of $Bi_2O_3:CeO_2:SiO_2:Lu_2O_3:Y_2O_3=y:0.002:1:0.899-y:0.1$ (y=0.000005, 0.00001, 0.0001, 0.001, 0.003, 0.005, 0.01, 0.02), and the subsequent steps are the same as those in Example 1, thus single crystals of $Lu_{1.798-2y}Y_{0.2}Ce_{0.002}Bi_{2y}SiO_5$ are obtained.

Example 17 (Preparation of Bi Doped Polycrystalline Powders)

The materials according to Example 16 are mixed, the following steps are the same as those in Example 2, and $Lu_{1.798-2y}Y_{0.2}Ce_{0.002}Bi_{2y}SiO_5$ polycrystalline powder is obtained.

Example 18 (Preparation of Bi Doped Ceramics)

$Lu_{1.798-2y}Y_{0.2}Ce_{0.002}Bi_{2y}SiO_5$ opaque ceramics and transparent ceramics are prepared according to Example 16, and the subsequent steps are the same as those of Example 3.

Example 19 (Growth of Hg Doped Single Crystals)

The materials are mixed according to the molar ratio of $HgO:CeO_2:SiO_2:Y_2O_3=2y:0.002:1:0.899-y:0.1$ (y=0.000005, 0.00001, 0.0001, 0.001, 0.003, 0.005, 0.01, 0.02), and the subsequent steps are the same as those in Example 1, thus single crystals of $Lu_{1.798-2y}Y_{0.2}Ce_{0.002}Hg_{2y}SiO_5$ are obtained.

Example 20 (Preparation of Hg Doped Polycrystalline Powders)

The materials according to Example 19 are mixed, the following steps are the same as those in Example 2, and $Lu_{1.798-2y}Y_{0.2}Ce_{0.002}Hg_{2y}SiO_5$ polycrystalline powder is obtained.

Example 21 (Preparation of Hg Doped Ceramics)

$Lu_{1.798-2y}Y_{0.2}Ce_{0.002}Hg_{2y}SiO_5$ opaque ceramics and transparent ceramics are prepared according to Example 19 and the subsequent steps are the same as those in Example 3.

Example 22 (Growth of Ag Doped Single Crystals)

The materials are mixed according to the molar ratio of $Ag_2O:CeO_2:SiO_2:Lu_2O_3:Y_2O_3=y:0.002:1:0.899-y:0.1$ (y=0.000005, 0.00001, 0.0001, 0.001, 0.003, 0.005, 0.01, 0.02), and the subsequent steps are the same as those in Example 1, thus single crystals of $Lu_{1.798-2y}Y_{0.2}Ce_{0.002}Ag_{2y}SiO_5$ are obtained.

Example 23 (Preparation of Ag Doped Polycrystalline Powders)

The materials according to Example 22 are mixed, the following steps are the same as those in Example 2, and $Lu_{1.798-2y}Y_{0.2}Ce_{0.002}Ag_{2y}SiO_5$ polycrystalline powder is obtained.

Example 24 (Preparation of Ag Doped Ceramics)

$Lu_{1.798-2y}Y_{0.2}Ce_{0.002}Ag_{2y}SiO_5$ opaque ceramics and transparent ceramics are prepared according to Example 22 and the subsequent steps are the same as those in example 3.

Example 25 (Growth of Ni Doped Single Crystals)

The materials are mixed according to the molar ratio of $Ni_2O_3:CeO_2:SiO_2:Lu_2O_3:Y_2O_3=y:0.002:1:0.899-y:0.1$ (y=0.000005, 0.00001, 0.0001, 0.001, 0.003, 0.005, 0.01, 0.02), and the subsequent steps are the same as those in Example 1, thus single crystals of $Lu_{1.798-2y}Y_{0.2}Ce_{0.002}Ni_{2y}SiO_5$ are obtained.

Example 26 (Preparation of Ni Doped Polycrystalline Powders)

The materials according to Example 25 are mixed, the following steps are the same as those in Example 2, and $Lu_{1.798-2y}Y_{0.2}Ce_{0.002}Ni_{2y}SiO_5$ polycrystalline powder are obtained.

Example 27 (Preparation of Ni Doped Ceramics)

$Lu_{1.798-2y}Y_{0.2}Ce_{0.002}Ni_{2y}SiO_5$ opaque ceramics and transparent ceramics are prepared according to Example 25, and the subsequent steps are the same as those in Example 3.

Example 28 (Growth of Ca, Te/Cd/Tc/Re Doped Single Crystals)

The materials are mixed according to the ratio of $CaO:(TeO_2/CdO/TcO_2/ReO_2)$ $CeO_2:SiO_2:Lu_2O_3:Y_2O_3=2y:2w:0.002:1:0.899-y-w:0.1$ (y=0.001, 0.003, 0.005, 0.01, 0.02; w=0.001, 0.003, 0.005, 0.01), and the subsequent steps are the same as those in Example 1, thus single crystals of $Lu_{1.798-2y}Y_{0.2}Ce_{0.002}Ca_{2y}(Te/Cd/Tc/Re)_{2w}SiO_5$ are obtained.

Example 29 (Preparation of Ca, Ga Doped Polycrystalline Powders)

The materials are mixed according to the ratio of $CaO:Ga_2O_3:CeO_2:SiO_2:Lu_2O_3:Y_2O_3=2y:w:0.002:1:0.899-y-w:0.1$ (y=0.001, 0.003, 0.005, 0.01, 0.02; w=0.001, 0.003, 0.005, 0.01), the following steps are the same as those in Example 2, and $Lu_{1.798-2y}Y_{0.2}Ce_{0.002}Ca_{2y}Ga_{2w}SiO_5$ polycrystalline powder is obtained.

Example 30 (Preparation of Cu Doped Ceramics)

The materials are mixed according to the ratio of $CuO:CeO_2:SiO_2:Y_2O_3=2y:0.002:1:0.999-y$ (y=0.001, 0.003, 0.005, 0.01, 0.02). The following steps are the same as those of Example 3, and $Lu_{1.798-2y}Y_{0.2}Ce_{0.002}Cu_{2y}SiO_5$ opaque ceramic is obtained.

Example 31 (Growing in Doped Single Crystals)

The materials are mixed according to the ratio of $In_2O_3$: $CeO_2$:$SiO_2$:$Lu_2O_3$:$Y_2O_3$=y:0.002:1:0.899-y:0.1 (y=0.000005, 0.00001, 0.0001, 0.001, 0.003, 0.005, 0.01, 0.02), and the subsequent steps are the same as those in Example 1, thus single crystals of $Lu_{1.798-2y}Y_{0.2}Ce_{0.002}In_{2y}SiO_5$ are obtained.

Example 32 (Preparation of in Doped Polycrystalline Powders)

The materials according to Example 31 are mixed, the following steps are the same as those in Example 2, and $Lu_{1.798-2y}Y_{0.2}Ce_{0.002}In_{2y}SiO_5$ polycrystalline powder is obtained.

Example 33 (Preparation of in Doped Ceramics)

The materials according to Example 31 are mixed, the following steps were the same as those of Example 3, and $Lu_{1.798-2y}Y_{0.2}Ce_{0.002}In_{2y}SiO_5$ opaque ceramics and transparent ceramics are obtained.

Example 34 (Growth of in Doped Single Crystal by the Bridgman Descent Method)

According to the molar ratio of $In_2O_3$:$CeO_2$:$SiO_2$:$Lu_2O_3$: $Y_2O_3$=y:0.002:1:0.899 -y:0.1 (y=0.000005, 0.00001, 0.0001, 0.001, 0.015), mix fully and uniformly and press into blocks to obtain a mixture block body. The mixture block is put into a tungsten/molybdenum/iridium/graphite/rhenium/tantalum crucible and sealed with a crucible lid or welded. The atmosphere in the crucible is argon or nitrogen gas, or one or more mixed gases of argon/nitrogen mixed with a small amount of carbon dioxide/carbon monoxide/hydrogen. Then, the mixture block is fully melted by induction heating, and the crucible descends 0.5-10 mm/h away from the coil. The rotation speed is maintained at 0-50 rpm. After the temperature reduction is finished, the crystal is taken out from the crucible. The tungsten/molybdenum/graphite/rhenium/tantalum crucible crystal needs to be annealed at 1000-1600° C. for 1-100 hours in the air atmosphere to obtain $Lu_{1.798-2y}Y_{0.2}Ce_{0.002}In_{2y}SiO_5$ single crystals.

Example 35 (Growth of Ni Doped Single Crystal by Kyropoulos Method)

The mixture is prepared by mixing $Ni_2O_3$:$CeO_2$:$SiO_2$: $Lu_2O_3$:$Y_2O_3$=y:0.002:1:0.899-y:0.1 (y=0.000005, 0.00001, 0.0001, 0.001, 0.015) in a molar ratio, is fully and uniformly mixed, and pressed into blocks to obtain a mixture block. The mixture block is put into a tungsten/molybdenum/iridium/graphite/rhenium/tantalum crucible which is perforated at the lower end. The atmosphere in the crucible is argon or nitrogen gas, or one or more mixed gases of argon/nitrogen mixed with a small amount of carbon dioxide/carbon monoxide/hydrogen. Then, the mixture block is fully melted by induction heating, the seed crystal rod carrying the crucible cover is extended to the opening of the crucible, and the crucible cover is closed by continuously descending. The seed crystal makes contact with the melt, and is rotated at 10-100 rpm. The crystal is gradually grown by gradually reducing the temperature. When the melt is exhausted by the crystal, the crystal is pulled up for a section, the temperature is reduced, and the crystal is taken out. Wherein the tungsten/molybdenum/graphite/rhenium/tantalum crucible crystal needs to be annealed at 1000-1600° C. for 1-100 hours to obtain $Lu_{1.798-2y}Y_{0.2}Ce_{0.002}Ni_{2y}SiO_5$ single crystals.

Example 36 (Growth of Ti Doped Single Crystals by Micro Pull Down Method)

The materials are mixed according to the molar ratio of $TiO_2$:$CeO_2$:$SiO_2$:$Lu_2O_3$:$Y_2O_3$=2y:0.002:1:0.899-y:0.1 (y=0.00005, 0.0001, 0.00025, 0.0005, 0.001, 0.0012, 0.003, 0.005, 0.01, 0.02). The mixture is fully mixed and pressed into blocks to obtain a mixture block. The mixture block is put into a tungsten/molybdenum/iridium/graphite/rhenium/tantalum crucible which is perforated at the lower end. The atmosphere in the crucible is argon or nitrogen gas, or one or more mixed gases of argon or nitrogen mixed with a small amount of carbon dioxide/carbon monoxide/hydrogen. Then, the mixture block is fully melted by induction heating, and the seed crystal is extended to the opening of the lower edge of the crucible, and the melt can automatically and fully moisten the crucible mouth and the seed crystal. The seed crystal is pulled down by 1-100 mm/h. After the growth of the melt in the crucible is completed, the temperature is reduced, and the crystal is taken out. Wherein the tungsten/molybdenum/graphite/rhenium/tantalum crucible crystal needs to be annealed at 1000-1600° C. for 1-100 hours to obtain $Lu_{1.798-2y}Y_{0.2}Ce_{0.002}Ti_{2y}SiO_5$ single crystals.

Example 37 (Growth of Tl Doped Single Crystals)

The materials are mixed according to the molar ratio of $Tl_2O_3$:$CeO_2$:$SiO_2$:$Lu_2O_3$:$Y_2O_3$=y:0.002:1:0.899-y:0.1 (y=0.000005, 0.00001, 0.0001, 0.001, 0.003, 0.005, 0.01, 0.02), and the subsequent steps are the same as those in Example 1, thus single crystals of $Lu_{1.798-2y}Y_{0.2}Ce_{0.002}Tl_{2y}SiO_5$ are obtained.

Example 38 (Growth of Ta Doped Single Crystals)

The materials are mixed according to the molar ratio of $Ta_2O_5$:$CeO_2$:$SiO_2$:$Lu_2O_3$:$Y_2O_3$=y:0.002:1:0.899-y:0.1 (y=0.000005, 0.00001, 0.0001, 0.001, 0.003, 0.005, 0.01, 0.02), and the subsequent steps are the same as those in Example 1, thus single crystals of $Lu_{1.798-2y}Y_{0.2}Ce_{0.002}Ta_{2y}SiO_5$ are obtained.

Example 39 (Preparation of Ta Doped Polycrystalline Powders)

The materials according to Example 38 are mixed, the following steps are the same as those in Example 2, and $Lu_{1.798-2y}Y_{0.2}Ce_{0.002}Ta_{2y}SiO_5$ polycrystalline powder is obtained.

Example 40 (Growth of Sc, Te/Cd/Tc/Re Doped Single Crystals)

The materials are mixed according to the molar ratio of $Sc_2O_3$:($TeO_2$/$CdO$/$TcO_2$/$ReO_2$):$CeO_2$:$SiO_2$:$Lu_2O_3$: $Y_2O_3$=y:2w:0.002:1:0.899-y-2w:0.1 (y=0.001, 0.003, 0.005, 0.01, 0.02; w=0.001, 0.003, 0.005, 0.01), and the subsequent steps are the same as those in Example 1, thus single crystals of $Lu_{1.798-2y-2w}Y_{0.2}Ce_{0.002}Sc_{2y}(Te/Cd/Tc/Re)_{2w}SiO_5$ are obtained.

Example 41 (Growth of Mg, Te/Cd/Tc/Re Doped Single Crystals)

The materials are mixed according to the molar ratio of MgO:(TeO$_2$/CdO/TcO$_2$/ReO$_2$):CeO$_2$:SiO$_2$:Lu$_2$O$_3$:Y$_2$O$_3$=2y:2w:0.002:1:0.899−y−w:0.1 (y=0.001, 0.003, 0.005, 0.01, 0.02; w=0.001, 0.003, 0.005, 0.01), and the subsequent steps are the same as those in Example 1, thus single crystals of Lu$_{1.798−2y−2w}$Y$_{0.2}$Ce$_{0.002}$Mg$_{2y}$(Te/Cd/Tc/Re)$_{2w}$SiO$_5$ are obtained.

Example 42 (Growth of Sn Doped Single Crystals)

The materials are mixed according to the molar ratio of SnO$_2$:CeO$_2$:SiO$_2$:Lu$_2$O$_3$:Y$_2$O$_3$=2y:0.002:1:0.899−y:0.1 (y=0.000005, 0.00001, 0.0001, 0.001, 0.003, 0.005, 0.01, 0.02), and the subsequent steps are the same as those in Example 1, thus single crystals of Lu$_{1.798−2y}$Y$_{0.2}$Ce$_{0.002}$Sn$_{2y}$SiO$_5$ were obtained.

Example 43 (Preparation of Sn Doped Ceramics)

The materials according to Example 42 are mixed, the following steps are the same as in Example 3, thus Lu$_{1.798−2y}$Y$_{0.2}$Ce$_{0.002}$Sn$_{2y}$SiO$_5$ opaque ceramics are obtained.

Example 44 (Growth of Cd Doped Single Crystals)

The materials are mixed according to the molar ratio of CdO:CeO$_2$:SiO$_2$:Lu$_2$O$_3$:Y$_2$O$_3$=2y:0.002:1:0.899−y:0.1 (y=0.000005, 0.00001, 0.0001, 0.001, 0.003, 0.005, 0.01, 0.02), and the subsequent steps are the same as those in Example 1, thus single crystals of Lu$_{1.798−2y}$Y$_{0.2}$Ce$_{0.002}$Cd$_{2y}$SiO$_5$ are obtained.

Example 45 (Growth of Tc Doped Single Crystals)

The materials are mixed according to the molar ratio of TcO$_2$:CeO$_2$:SiO$_2$:Lu$_2$O$_3$:Y$_2$O$_3$=2y:0.002:1:0.899−y:0.1 (y=0.000005, 0.00001, 0.0001, 0.001, 0.003, 0.005, 0.01, 0.02), and the subsequent steps are the same as those in Example 1, thus single crystals of Lu$_{1.798−2y}$Y$_{0.2}$Ce$_{0.002}$Te$_{2y}$SiO$_5$ are obtained.

Example 46 (Growth of Zr Doped Single Crystals)

The materials are mixed according to the molar ratio of ZrO$_2$:CeO$_2$:SiO$_2$:Lu$_2$O$_3$:Y$_2$O$_3$=2y: 0.002:1:0.899−y:0.1 (y=0.001, 0.0012, 0.003, 0.005, 0.01, 0.02), and the subsequent steps are the same as those in Example 1, thus single crystals of Lu$_{1.798−2y}$Y$_{0.2}$Ce$_{0.002}$Zr$_{2y}$SiO$_5$ are obtained.

Example 47 (Preparation of Zr Doped Ceramics)

The materials are mixed according to the molar ratio of ZrO$_2$:CeO$_2$:SiO$_2$:Lu$_2$O$_3$:Y$_2$O$_3$=2y:0.002:1:0.899−y:0.1 (y=0.000005, 0.00001, 0.0001, 0.001, 0.0012, 0.003, 0.005, 0.01, 0.02), and the following steps are the same as those in Example 3, thus Lu$_{1.798−2y}$Y$_{0.2}$Ce$_{0.002}$Zr$_{2y}$SiO$_5$ opaque ceramics are obtained.

Example 48 (Growth of Re Doped Single Crystals)

The materials are mixed according to the molar ratio of ReO$_2$:CeO$_2$:SiO$_2$:Lu$_2$O$_3$:Y$_2$O$_3$=2y:0.002:1:0.899−y:0.1, and the subsequent steps are the same as those in example 1, thus single crystals of Lu$_{1.798−2y}$Y$_{0.2}$Ce$_{0.002}$Re$_{2y}$SiO$_5$ are obtained.

Example 49 (Growth of Ga Doped Single Crystals)

The materials are mixed according to the molar ratio of Ga$_2$O$_3$:CeO$_2$:SiO$_2$:Lu$_2$O$_3$:Y$_2$O$_3$=y:0.002:1:0.899−y:0.1 (y=0.0012, 0.003, 0.005, 0.01, 0.02), and the subsequent steps are the same as those in Example 1, thus single crystals of Lu$_{1.798−2y}$Y$_{0.2}$Ce$_{0.002}$Ga$_{2y}$SiO$_5$ are obtained.

Example 50 (Preparation of Zr, Cu Co-Doped Ceramics)

The materials are mixed according to the molar ratio of ZrO$_2$:CuO:CeO$_2$:SiO$_2$:Y$_2$O$_3$=2y:2w:0.002:1:0.999−y−w (y=0.001, 0.0012, 0.003, 0.005, 0.01, 0.02; w=0.001, 0.003, 0.005, 0.01). The following steps are the same as those in Example 3, thus Y$_{1.998−2y−2w}$Ce$_{0.002}$Zr$_{2y}$Cu$_{2w}$SiO$_5$ opaque ceramics are obtained.

Example 51 (Growth of Nb Doped Single Crystals)

The materials are mixed according to the molar ratio of Nb$_2$O$_3$:CeO$_2$:SiO$_2$:Lu$_2$O$_3$:Y$_2$O$_3$=y:0.002:1:0.899−y:0.1 (y=0.000005, 0.00001, 0.0001, 0.001, 0.003, 0.005, 0.01, 0.02), and the subsequent steps are the same as those in Example 1, thus single crystals of Lu$_{1.798−2y}$Y$_{0.2}$Ce$_{0.002}$Nb$_{2y}$SiO$_5$ are obtained.

Example 52 (Preparation of Nb Doped Ceramics)

The mixture is prepared as in Example 51, and the subsequent steps are the same as those in Example 3 in a non-transparent state.

Example 53 (Growth of Ti Doped Single Crystals)

The materials are mixed according to the molar ratio of TiO:CeO$_2$:SiO$_2$:Lu$_2$O$_3$:Y$_2$O$_3$=2y:0.002:1:0.899−y:0.1 (y=0.001, 0.0012, 0.003, 0.005, 0.01, 0.02), and the subsequent steps are the same as those in Example 1, thus single crystals of Lu$_{1.798−2y}$Y$_{0.2}$Ce$_{0.002}$Ti$_{2y}$SiO$_5$ are obtained.

Example 54 (Growth of Lu$_{1.8−2x−2y}$Y$_{0.2}$Ce$_{2x}$Re$_{2y}$SiO$_5$ Single Crystals)

Single crystals are grown by adopting a pulling method. The materials are mixed according to the molar ratio of ReO$_2$:CeO$_2$:SiO$_2$:Lu$_2$O$_3$:Y$_2$O$_3$=2y:2x:1:0.899−x−y:0.1 (x=0.001, 0.003, 0.005; y=0.001, 0.003, 0.005, 0.01, 0.02). The mixture is pressed into blocks under 2500 MPa cold isostatic pressure, and the blocks are put into an iridium crucible, and then heated and fully melted by induction. Single crystals with a preset size are slowly extracted from the melt after seed crystal inoculation, and single crystals of Lu$_{1.8−2x−2y}$Y$_{0.2}$Ce$_{2x}$Re$_{2y}$SiO$_5$ are obtained.

Example 55 (Growth of Lu$_{2(1−x−y)}$Ce$_{2x}$Te$_{2y}$SiO$_5$ Single Crystals)

Single crystals are grown by adopting a pulling method. The materials are mixed according to the molar ratio of TeO$_2$:CeO$_2$:SiO$_2$:Lu$_2$O$_3$=2y:2x:1:(1−x−y) (x=0.001, 0.003, 0.005; y=0.001, 0.003, 0.005, 0.01). The mixture is pressed into blocks under 2500 MPa cold isostatic pressure, and the blocks are put into an iridium crucible, and then heated and fully melted by induction. The single crystals with a pre-set size are slowly extracted from the melt after seed crystal inoculation, and single crystals of $Lu_{2(1-x-y)}Ce_{2x}Te_{2y}SiO_5$ are obtained.

Example 56 (Growth of $Gd_{2(1-x-y)}Ce_{2x}Te_{2y}SiO_5$ Single Crystals)

Single crystals are grown by adopting a pulling method. The materials are mixed according to the molar ratio of $CdO:CeO_2:SiO_2:Gd_2O_3=2y:2x:1:(1-x-y)$ (x=0.001, 0.003, 0.005, 0.01, 0.02, 0.05; y=0.001, 0.003, 0.005, 0.01, 0.02). The mixture is pressed into blocks under the 2500 MPa cold isostatic pressure, and the blocks are put into an iridium crucible, and then heated and fully melted by induction. The single crystals with a preset size are slowly extracted from the melt after seed crystal inoculation, and single crystals of $Gd_{2(1-x-y)}Ce_{2x}Te_{2y}SiO_5$ are obtained.

Example 57 (Preparation of $Gd_{2(1-x-y)}Ce_{2x}Tc_{2y}SiO_5$ Ceramics)

Non-transparent state: according to the molar ratio of $TcO_2:CeO_2:SiO_2:Gd_2O_3=2y:2x:1:(1-x-y)$ (x=0.001, 0.003, 0.005, 0.01, 0.02, 0.05; y=0.001, 0.003, 0.005, 0.01, 0.02), the materials are fully mixed uniformly, the mixture is pressed into blocks under 30 MPa cold isostatic pressure, and the blocks are put into a corundum crucible and sintered in a furnace at 2000° C. for 5 hours for a solid-state reaction to obtain $Gd_{2(1-x-y)}Ce_{2x}Tc_{2y}SiO_5$ non-transparent ceramics. Transparent: the materials are fully and uniformly mixed according to the above molar ratio, the mixture is pressed into blocks under 5000 MPa cold isostatic pressure, a solid-phase reaction is performed in a vacuum hot-pressing furnace, and bubbles and gaps are removed as much as possible to obtain $Gd_{2(1-x-y)}Ce_{2x}Tc_{2y}SiO_5$ transparent ceramics.

Example 58 (Growth of $Gd_{2(1-x-y-w-z)}Lu_{2w}Y_{2z}Ce_{2x}Te_{2y}SiO_5$ Single Crystals)

The materials are mixed according to the molar ratio of $TeO_2:CeO_2:SiO_2:Gd_2O_3:Lu_2O_3:Y_2O_3=2y:2x:1:(1-x-y-w-z):w:z$ (x=0.001, 0.003, 0.005, 0.01, 0.02, 0.05; y=0.001, 0.003, 0.005, 0.01, 0.02; z=0, 0.1, 0.2, 0.4, 0.6, 0.8, 0.9; w=0.9, 0.8, 0.6, 0.4, 0.2, 0.1, 0), and the subsequent steps are the same as those in Example 1, thus $Gd_{2(1-x-y-w-z)}Lu_{2w}Y_{2x}Ce_{2x}Te_{2y}SiO_5$ single crystals are obtained.

Figure 2:
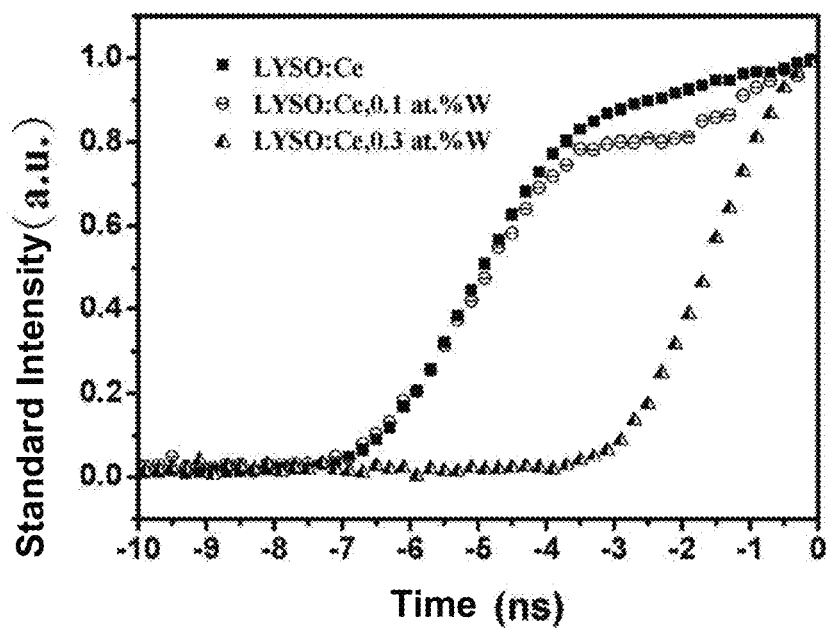
FIG. 2 shows a scintillation rise time spectrum for the non-transparent ceramic of example 3.

FIG. 1 is the scintillation decay time spectrum and fitting results of $Lu_{1.798-2y}Y_{0.2}Ce_{0.002}W_{2y}SiO_5$ (y=0, 0.1%, 0.3%) non-transparent ceramics (the solid line is the fitting curve of decay time without W doping; the dotted line is the fitting curve of decay time of 0.3% W doping). It can be seen from the figure that the decay time after W doping is significantly shortened from 41 ns to 27-28 ns;

FIG. 2 is the chart of rise time of $Lu_{1.798-2y}Y_{0.2}Ce_{0.002}W_{2y}SiO_5$ (y=0, 0.1%, 0.3%) non-transparent ceramics (the maximum point of all samples is fixed at the time zero, i.e. the time required for each sample to rise to the maximum is visible, and the rise time of 0.3% W doping is shortest in the graph), and it is known that the rise time is shortened from about 7 ns to less than 4 ns, which shows that the rise time has a significant qualitative effect.

Figure 3:
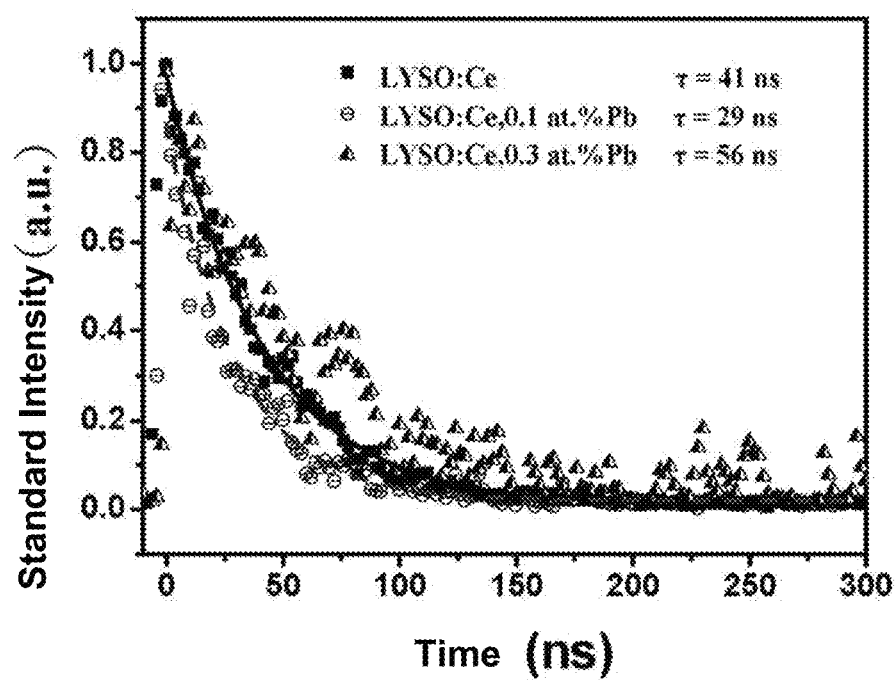
FIG. 3 shows a scintillation decay time spectrum and fitting results for the non-transparent ceramic of example 6.
Figure 4:
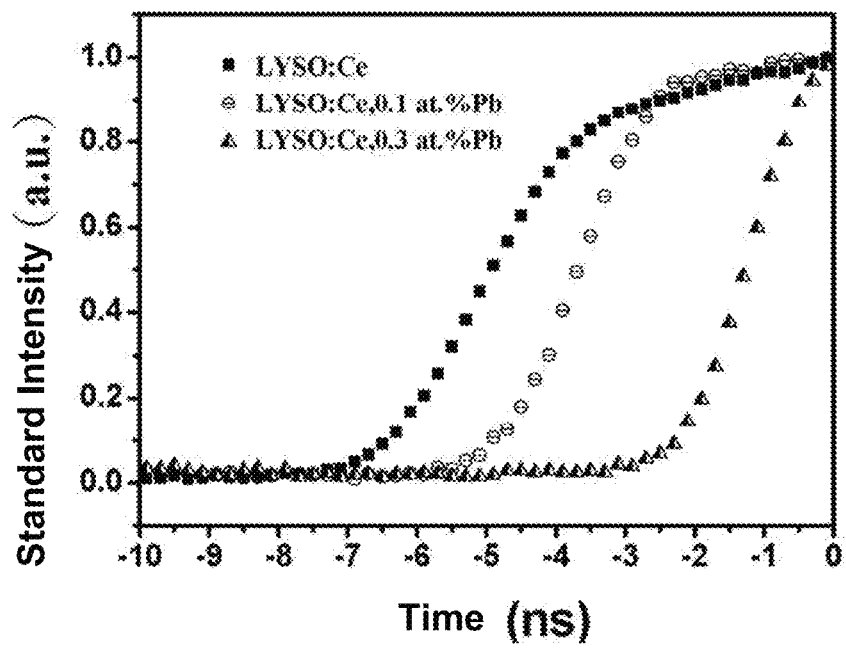
FIG. 4 shows a scintillation rise time spectrum of the non-transparent ceramic of example 6.

FIG. 3 shows the scintillation decay time spectrum and fitting results of $Lu_{1.798-2y}Y_{0.2}Ce_{0.002}Pb_{2y}SiO_5$ (y=0, 0.1%, 0.3%) non-transparent ceramics (the solid line is the fitting curve of decay time without W doping, and the dotted line is the decay time fitting curve with 0.1% Pb doping). It can be seen from the figure that the decay time is shortened from 41 ns to 29 ns;

FIG. 4 is the scintillation rise time spectrum of $Lu_{1.798-2y}Y_{0.2}Ce_{0.002}Pb_{2y}SiO_5$ (y=0, 0.1%, 0.3%) non-transparent ceramics (the time required for each sample to rise to the maximum value can be seen by fixing the maximum point of all samples at the time zero point, and the rise time of 0.3% Pb doping can be seen as the shortest in the spectrum), and it can be seen from the graph that the rise time is shortened from about 7 ns to less than 3 ns, which qualitatively shows that the rise time has a significant shortening effect.

Figure 5:
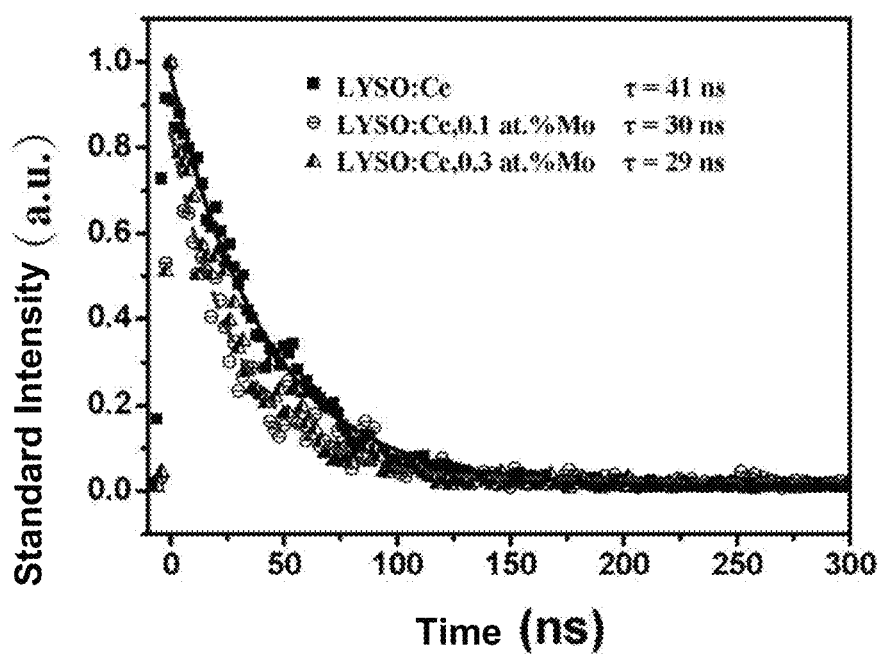
FIG. 5 shows a scintillation decay time spectrum and fitting results for the non-transparent ceramic of example 9.
Figure 6:
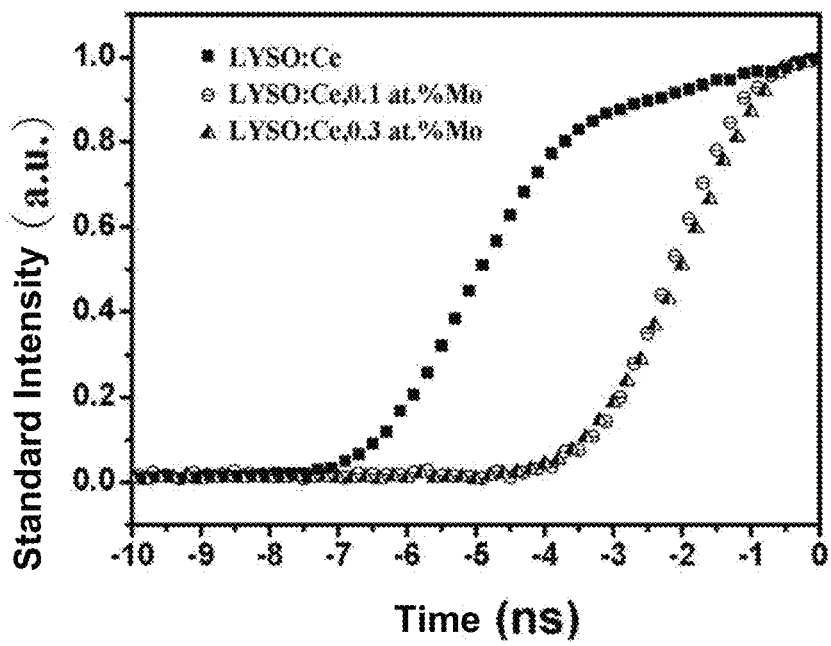
FIG. 6 shows a scintillation rise time spectrum of the non-transparent ceramic of example 9.

FIG. 5 shows the scintillation decay time spectrum and fitting results of $Lu_{1.798-2y}Y_{0.2}Ce_{0.002}Mo_{2y}SiO_5$ (y=0, 0.1%, 0.3%) non-transparent ceramics (the solid line is the fitting curve of decay time without Mo doping, and the dotted line is the decay time fitting curve with 0.1% Mo doping). It can be seen from the figure that the decay time is shortened from 41 ns to 29-30 ns;

FIG. 6 is the scintillation rise time chart of $Lu_{1.798-2y}Y_{0.2}Ce_{0.002}Mo_{2y}SiO_5$ (y=0, 0.1%, 0.3%) non-transparent ceramics (the time required for each sample to rise to the maximum value can be seen by fixing the maximum point of all samples at the time zero point, and the rise time of 0.1% and 0.3% Mo doping can be seen to be obviously shortened, and the rise time can be found to be shortened from about 7 ns to less than 4 ns, which qualitatively shows that the rise time has a significant shortening effect.

Figure 7:
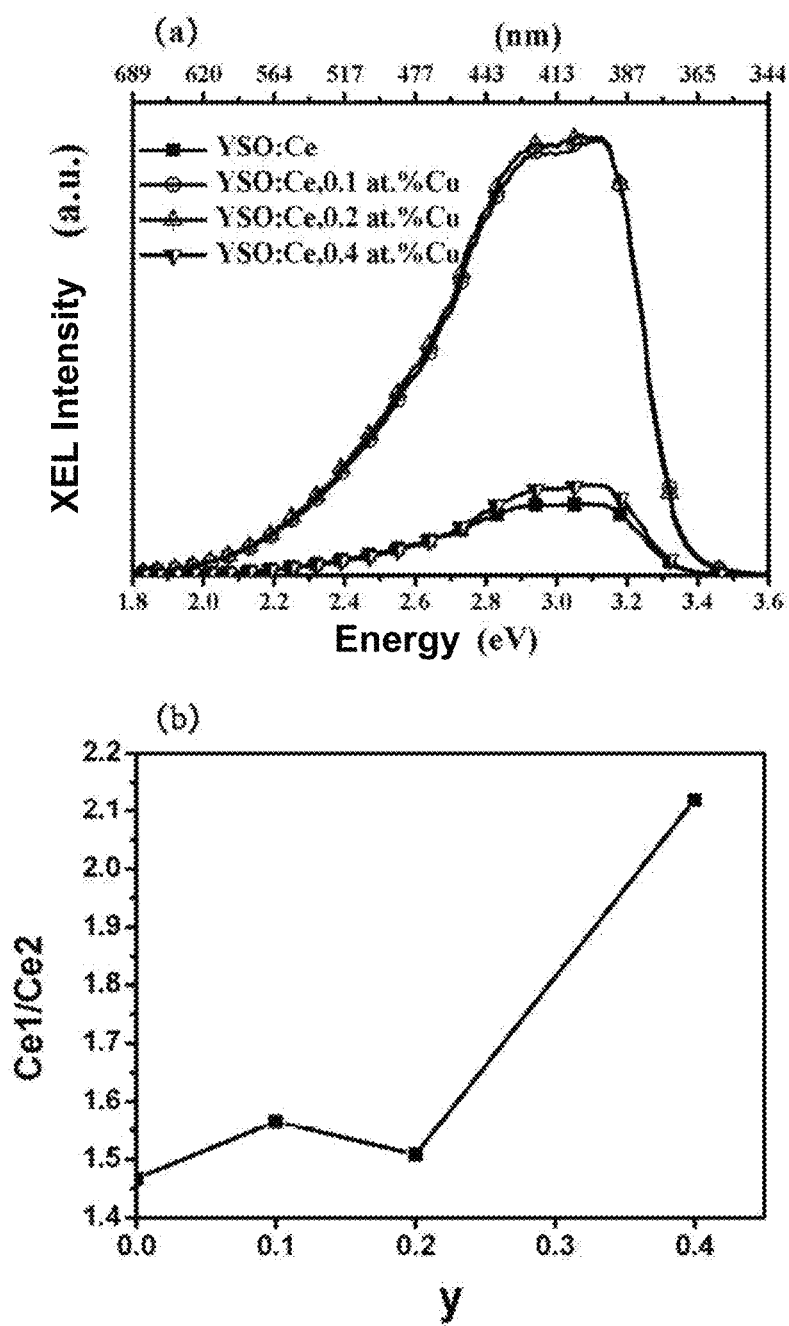
FIG. 7 shows an X-ray excited luminescence (XEL) plot of the non-transparent ceramic of example 30 and a plot fitted with content variations of Ce1 and Ce2.

FIG. 7 is the XEL diagram (a) of $Lu_{1.798-2y}Y_{0.2}Ce_{0.002}Cu_{2y}SiO_5$ (y=0, 0.1%, 0.2%, 0.4%) non-transparent ceramics and graph (b) fitted with the change of Ce1/Ce2 content changing with y (b). It can be seen that the content of Ce1/Ce2 ($[CeO_7]/[CeO_6]$) is significantly increased from less than 1.5 to more than 2.1. The content of Ce1/Ce2 ($[CeO_7]/[CeO_6]$) was fitted from an XEL diagram which was assigned the emission peaks to Ce1 (ca. 3.2 and 2.9 eV) and Ce2 (ca. 2.7 and 2.5 eV) emission through a Gaussian function.

Figure 8:
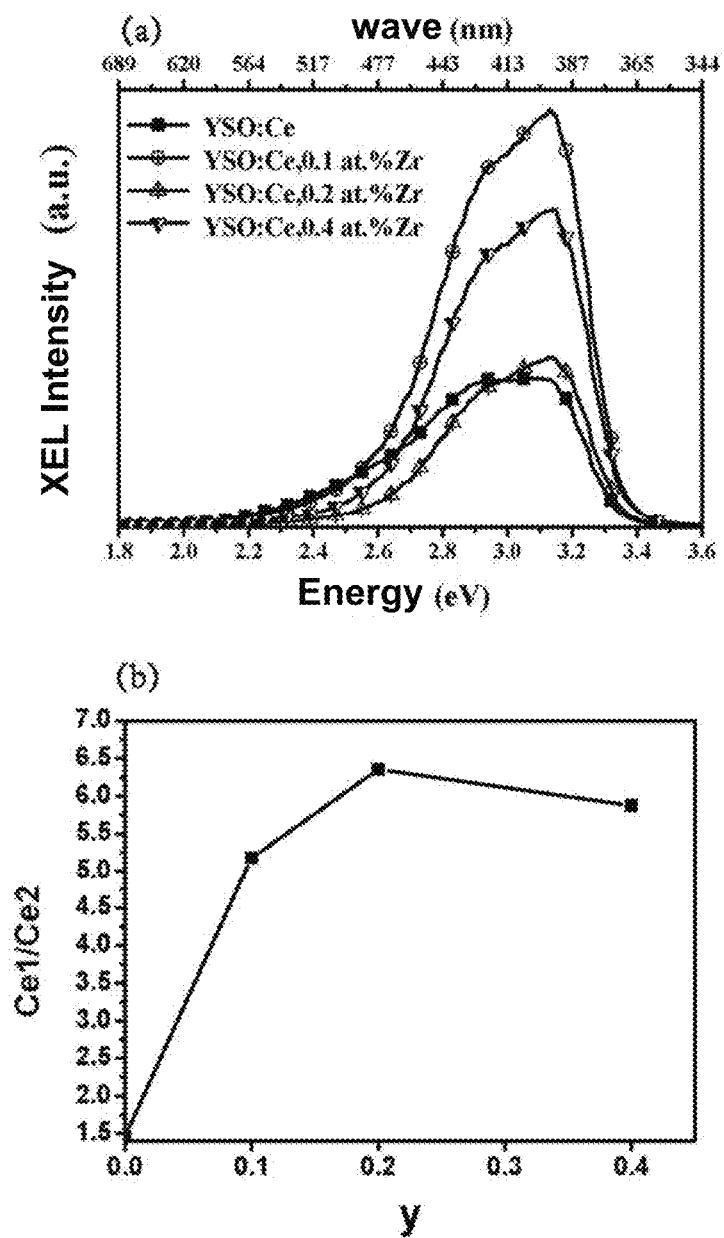
FIG. 8 shows a XEL plot of the non-transparent ceramic of example 47 and a plot fitted with content variations of Ce1 and Ce2.

FIG. 8 is the XEL spectrum (a) of $Lu_{1.798-2y}Y_{0.2}Ce_{0.002}Zr_{2y}SiO_5$ (y=0, 0.1%, 0.2%, 0.4%) non-transparent ceramics and a graph (b) fitted with the content of Ce1/Ce2 as a function of y, wherein the X-ray excitation strength is obviously enhanced, and the content of Ce1/Ce2 ($[CeO_7]/[CeO_6]$) is obviously increased from less than 1.5 to 5-6.5.

Figure 9:
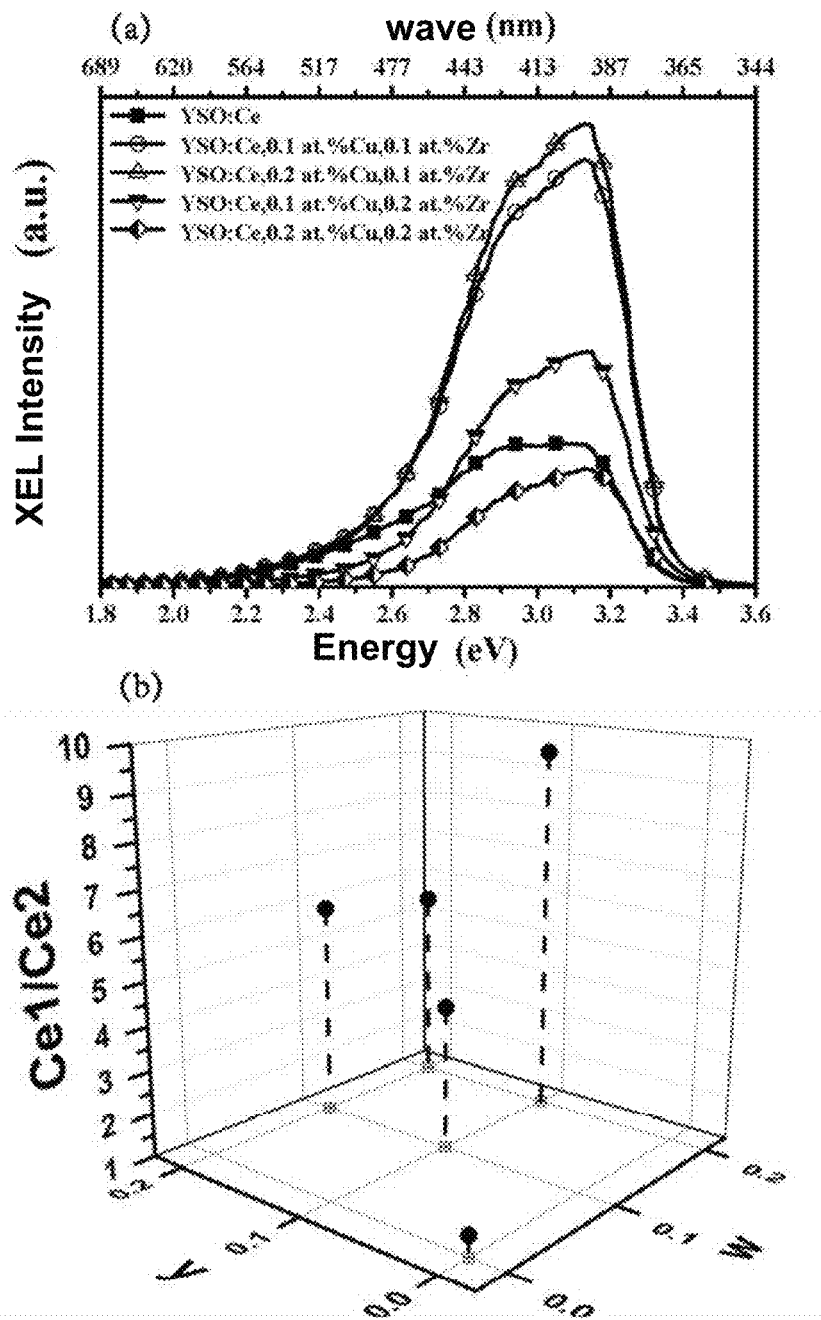
FIG. 9 shows a XEL plot of the non-transparent ceramic of example 50 and a plot fitted with content variations of Ce1 and Ce2.

FIG. 9 shows the XEL spectrum (a) of $Y_{1.998-2y-2w}Ce_{0.002}Zr_{2y}Cu_{2w}SiO_5$ (y=0, w=0; y=0.1%, w=0.1%; y=0.1%, w=0.2%; y=0.2%, w=0.1%; y=0.2%, w=0.2%) non-transparent ceramics and the fitted graph (b) of Ce1/Ce2 content as a function of y and w. It can be seen from the graph that the X-ray excitation intensity is significantly enhanced, and Ce1/Ce2 ($[CeO_7]/[CeO_6]$) is significantly increased from below 1.5 to 4-10.

Figure 10:
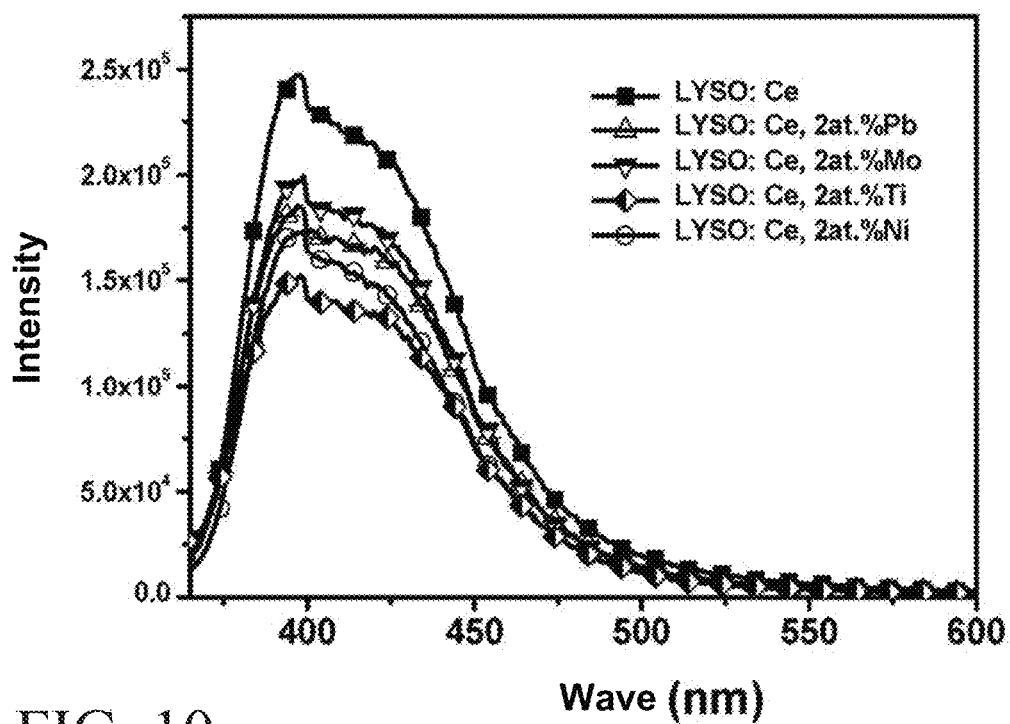
FIG. 10 shows the fluorescence emission spectra of examples 6, 9, 27, and 53 with an M content of 2 at. % (excitation light at 358 nm)

When the content y of the strong electron-affinitive element M in $RE_{2(1-x-y)}Ce_{2x}M_{2y}SiO_5$ is more than 0.015 (i.e., y>0.015, x fixed at 0.002), it is difficult to prepare a complete single crystal due to impurity content that is too high, and at least one of the scintillation light output/light yield, energy resolution, fluorescence emission intensity or X-ray excitation emission intensity deteriorated by >20%. As shown in FIG. 10, the deteriorated fluorescence emission intensity (excitation light is 358 nm) was larger than 20%, when the doping content of Pb, Mo, Ti, Ni was 2 at. %.

Figure 11:
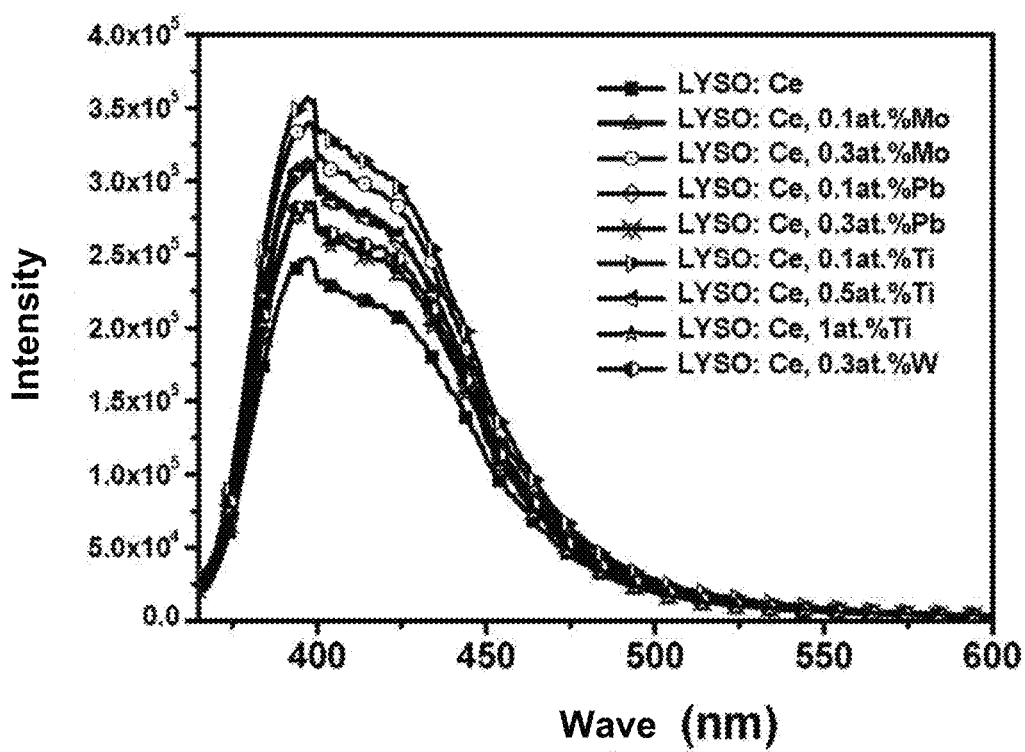
FIG. 11 shows the fluorescence emission spectra of examples 3, 6, 9 and 53 (excitation light at 358 nm)

FIG. 11 shows the fluorescence emission spectrum (excitation light is 358 nm) of Pb, Mo, Ti, and W doped rare earth orthosilicate scintillation materials with different contents y≤0.015 (x fixed at 0.002). It can be seen that the fluorescence emission intensity is significantly enhanced.

Figure 12:
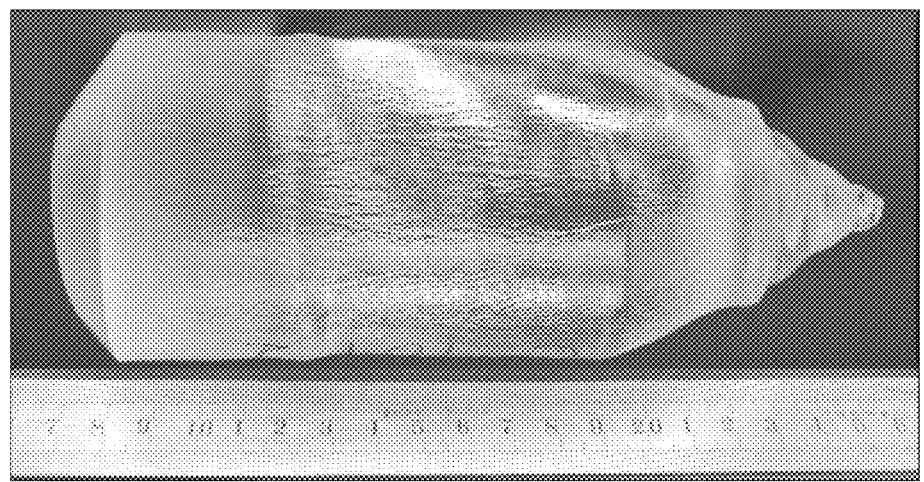
FIG. 12 shows the photograph of a grown single crystal of Example 53 (y=0.0012)

FIG. 12 is the photograph of a grown single crystal of $Lu_{1.798-2y}Y_{0.2}Ce_{0.002}Ti_{2y}SiO_5$ (y=0.12%), as shown, the single crystals can be well grown for Φ 75×120 mm².

Figure 13:
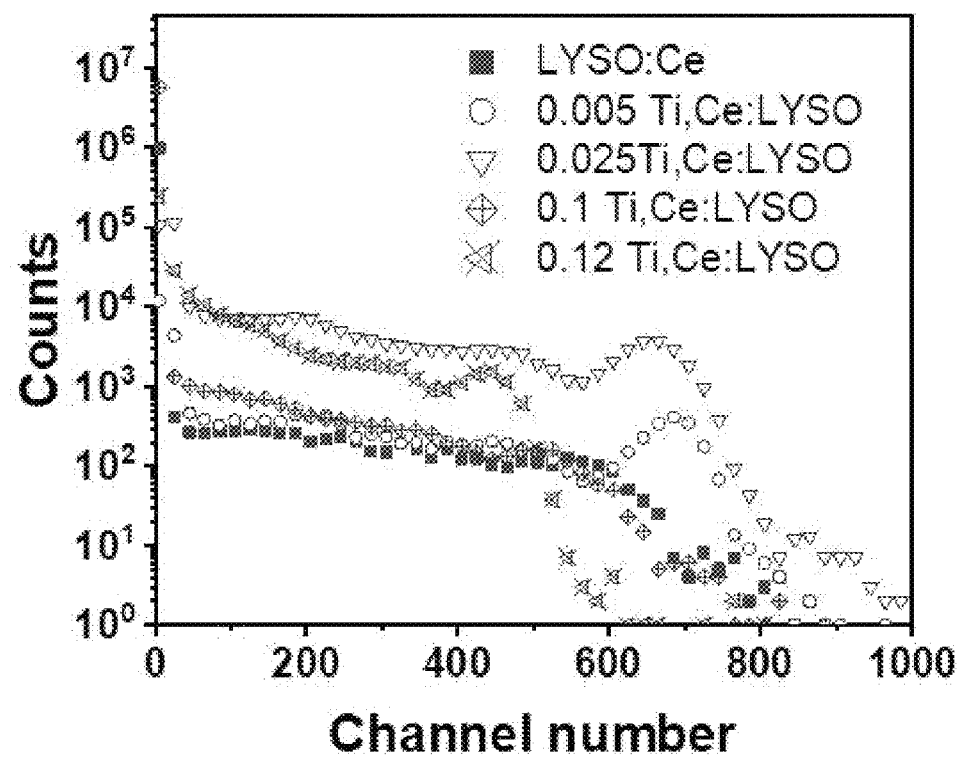
FIG. 13 and FIG. 14 reveal the scintillation light output/light yield and decay time of Example 36.
Figure 14:
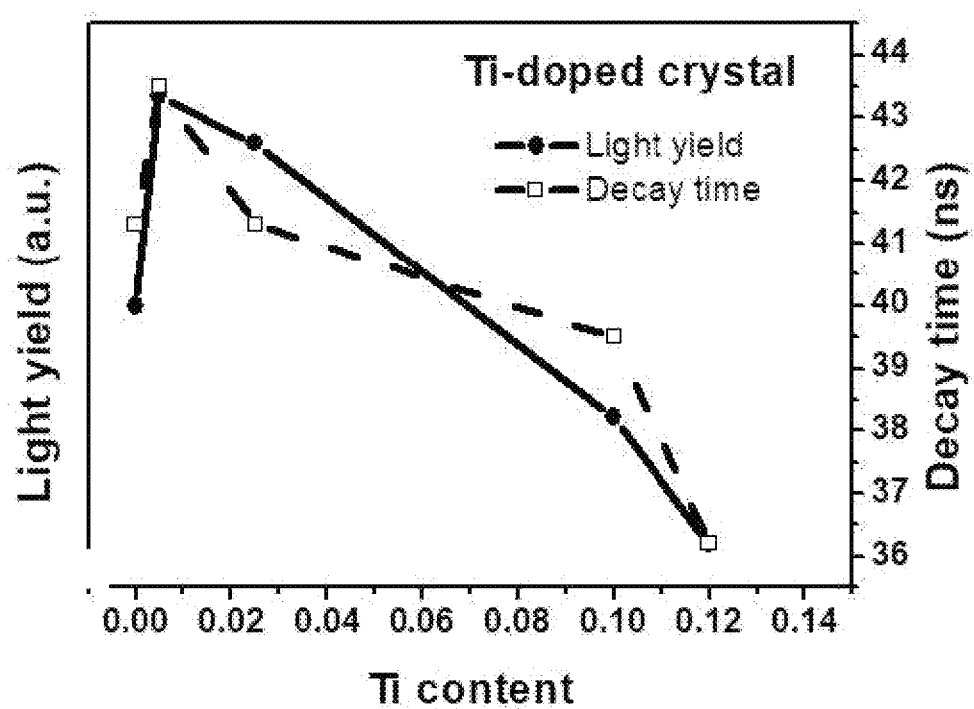

FIG. 13 and FIG. 14 reveal the scintillation light output/light yield and decay time of $Lu_{1.798-2y}Y_{0.2}Ce_{0.002}Ti_{2y}SiO_5$ (y=0.005%, 0.025%, 0.1%, 0.12%). The content of y=0.005%, 0.025% exhibits an increase of light output and almost no change of decay time. When the content of y=0.1%, similar light output is obtained with non-doped rare earth orthosilicate scintillation materials and there is a slight shortening of decay time. When the content of y=0.12%, there is a significant shortening of decay time (from 41 ns to ca. 36 ns) and a slight decline in light output (ca. 80-90% of non-doped rare earth orthosilicate scintillation materials).

TABLE 1 summary of decay time for some of the strong electron-affinitive elements M doped rare earth orthosilicate scintillation materials.

| | | Decay time (ns) | |
|---|---|---|---|
| | Doped element | 0.1 at. % | 0.3 at. % |
| Example 6 | Pb | 28.5 | 56.4 |
| Example 9 | Mo | 29.8 | 29.4 |
| Example 43 | Sn | 28.9 | 27.5 |
| Example 52 | Nb | 30 | 28.9 |
| Example 39 | Ta | 29.5 | 30.2 |
| Example 3 | W | 28.2 | 27.3 |
| Example 15 | Sb | 29.2 | 29.1 |
| Example 18 | Bi | 30 | 30.8 |
| Example 27 | Ni | 26.9 | 24.4 |
| Example 53 | Ti | 33.4 | 27.4 |
| Example 49 | Ga | 34.2 | 33.4 |
| Rare earth orthosilicate scintillation materials ($Lu_{1.798}Y_{0.2}Ce_{0.002}SiO_5$). | | 41 | |

The above examples are only for further illustration of the present invention, and should not be understood as limiting the protection scope of the present invention. Some non-essential modifications and adjustments thereof by those skilled in the art according to the above descriptions are within the protection scope of the present invention.

The invention claimed is:

1. A scintillation material of rare earth orthosilicate doped with a strong electron-affinitive element, the chemical formula of the scintillation material being:
$RE_{2(1-x-y+\delta/2-a)}Ce_{2x}M_{(2y-\delta)}A_{2a}Si_{(1-\delta)}M_\delta O_5$, wherein
RE is rare earth ions, and M is strong electron-affinitive doping elements,
the value of x is 0<x≤0.05, the value of y is 0<y≤0.015, the value of δ is 0≤δ≤10⁻⁴, and the value of a is 0≤a≤0.01,
M is selected from at least one of tungsten, lead, molybdenum, tellurium, antimony, bismuth, mercury, silver, nickel, indium, thallium, niobium, titanium, tantalum, tin, cadmium, technetium, zirconium, rhenium, and gallium, and
A is selected from at least one of lithium, sodium, potassium, rubidium, cesium, magnesium, calcium, strontium, scandium, and copper.

2. The scintillation material according to claim 1, wherein when M is selected from at least one of tungsten, lead, molybdenum, tellurium, antimony, bismuth, mercury, silver, nickel, indium, thallium, niobium, tantalum, tin, cadmium, technetium and rhenium, the value of y is 0.000005≤y≤0.015, and
when M is selected from at least one of titanium, zirconium, and gallium, the value of y is 0.0006≤y≤0.015.

3. The scintillation material according to claim 1, wherein a molar ratio of $[CeO_7]$ and $[CeO_6]$ in the scintillation material is (4~100):1.

4. The scintillation material according to claim 1, wherein RE is selected from at least one of lanthanum, cerium, praseodymium, neodymium, promethium, samarium, europium, gadolinium, terbium, dysprosium, holmium, erbium, thulium, ytterbium, lutetium, scandium, and yttrium.

5. The scintillation material according to claim 1, wherein the value of a is 0<a≤0.01.

6. The scintillation material according to claim 1, wherein the scintillation material is polycrystalline powders, ceramics, or single crystals.

7. A method for preparing scintillation polycrystalline powder of rare earth orthosilicate doped with a strong electron-affinitive element, the method comprising:
according to the chemical formula of the scintillation polycrystalline powder, weighing at least one of an oxide of A or a carbonate of A, an oxide of M, $CeO_2$, $SiO_2$, and an oxide of RE, and mixing to obtain a mixture powder, where A is selected from at least one of lithium, sodium, potassium, rubidium, cesium, magnesium, calcium, strontium, scandium, and copper; and
carrying out a solid-phase reaction on the obtained mixture powder at 1000-2000° C. for 5 to 200 hours to obtain cerium co-doped orthosilicate polycrystalline powder, wherein
the chemical formula of the scintillation polycrystalline powder is:
$RE_{2(1-x-y+\delta/2-a)}Ce_{2x}M_{(2y-\delta)}A_{2a}Si_{(1-\delta)}M_\delta O_5$,
RE is rare earth ions, and M is strong electron-affinitive doping elements,
the value of x is 0<x≤0.05, the value of y is 0<y≤0.015, the value of δ is 0≤δ≤10⁻⁴, and the value of a is 0≤a≤0.01,
M is selected from at least one of tungsten, lead, molybdenum, tellurium, antimony, bismuth, mercury, silver, nickel, indium, thallium, niobium, titanium, tantalum, tin, cadmium, technetium, zirconium, rhenium, and gallium, and
A is selected from at least one of lithium, sodium, potassium, rubidium, cesium, magnesium, calcium, strontium, scandium, and copper.

8. A method for preparing a scintillation ceramic of rare earth orthosilicate doped with a strong electron-affinitive element, the method comprising:
according to the chemical formula of the scintillation ceramic, weighing at least one of an oxide of A or a carbonate of A, an oxide of M, $CeO_2$, $SiO_2$, and an oxide of RE to obtain a mixture powder, where A is selected from at least one of lithium, sodium, potassium, rubidium, cesium, magnesium, calcium, strontium, scandium, and copper; and
pressing the obtained mixture powder, and carrying out a solid-phase reaction at 1000-2000° C. for 5 to 200 hours to obtain cerium co-doped orthosilicate scintillation ceramic, the pressure for the press forming being 0.03 to 5 GPa, wherein
the chemical formula of the scintillation ceramic is:
$RE_{2(1-x-y+\delta/2-a)}Ce_{2x}M_{(2y-\delta)}A_{2a}Si_{(1-\delta)}M_\delta O_5$,
RE is rare earth ions, and M is strong electron-affinitive doping elements, the value of x is 0<x≤0.05, the value of y is 0<y≤0.015, the value of δ is 0≤δ≤10⁻⁴, and the value of a is 0≤a≤0.01, M is selected from at least one of tungsten, lead, molybdenum, tellurium, antimony, bismuth, mercury, silver, nickel, indium, thallium, niobium, titanium, tantalum, tin, cadmium, technetium, zirconium, rhenium, and gallium, and A is selected from at least one of lithium, sodium, potassium, rubidium, cesium, magnesium, calcium, strontium, scandium, and copper.

9. A method for preparing a scintillation single crystal of rare earth orthosilicate doped with a strong electron-affinitive element, the method comprising:

according to the chemical formula of the single crystal, weighing at least one of an oxide of A or a carbonate of A, an oxide of M, CeO2, SiO2, and an oxide of RE to obtain a mixture powder, where A is selected from at least one of lithium, sodium, potassium, rubidium, cesium, magnesium, calcium, strontium, scandium, and copper;

heating the obtained mixture powder to be molten; and growing the scintillation single crystal by adopting a pulling method, a Bridgman method, a temperature gradient (TGT) method, a heat-exchange method, a Kyropoulos method, a top-seeded solution growth (TSSG) method, a fluxing agent crystal growth method, or a micro pull-down (μ-PD) method, wherein the chemical formula of the single crystal is:

$RE_{2(1-x-y+\delta/2-a)}Ce_{2x}M_{(2y-\delta)}A_{2a}Si_{(1-\delta)}M_\delta O_5$, RE is rare earth ions, and M is strong electron-affinitive doping elements, the value of x is 0<x≤0.05, the value of y is 0<y≤0.015, the value of δ is 0≤δ≤10⁻⁴, and the value of a is 0≤a≤0.01, M is selected from at least one of tungsten, lead, molybdenum, tellurium, antimony, bismuth, mercury, silver, nickel, indium, thallium, niobium, titanium, tantalum, tin, cadmium, technetium, zirconium, rhenium, and gallium, and A is selected from at least one of lithium, sodium, potassium, rubidium, cesium, magnesium, calcium, strontium, scandium, and copper.

10. An application of the scintillation material according to claim 1, in the fields of high-energy physical detection for particle discrimination and fast-responsible nuclear medical imaging.

* * * * *